United States Patent [19]

Karlsson et al.

[11] Patent Number: 4,701,698

[45] Date of Patent: Oct. 20, 1987

[54] MICROPROCESSOR BASED ENERGY CONSUMPTION METER

[76] Inventors: Björn Karlsson, Fyrklöversegatan 125, Nödinge, Sweden, 440 45; Ingvar Jönsson, Slåttervallsgatan 9, Mölndal, Sweden, 431 40

[21] Appl. No.: 914,519

[22] PCT Filed: Jun. 4, 1981

[86] PCT No.: PCT/SE81/00163
§ 371 Date: Jan. 26, 1982
§ 102(e) Date: Jan. 26, 1982

[87] PCT Pub. No.: WO81/03541
PCT Pub. Date: Dec. 10, 1981

Related U.S. Application Data

[63] Continuation of Ser. No. 684,173, Dec. 21, 1984, abandoned, which is a continuation of Ser. No. 348,052, Jan. 26, 1982, abandoned.

[30] Foreign Application Priority Data

Jun. 6, 1980 [SE] Sweden .............................. 8004239

[51] Int. Cl.$^4$ ..................... G01R 15/08; G01R 11/64; G06F 15/20
[52] U.S. Cl. ................. 324/116; 324/103 R; 364/483
[58] Field of Search ............. 324/116, 103 R, 142; 364/483

[56] References Cited

U.S. PATENT DOCUMENTS

| 593,852 | 11/1897 | Oxley | 324/116 |
| 4,162,530 | 7/1979 | Kusui et al. | 324/116 |
| 4,179,654 | 12/1979 | Germer | 324/116 |
| 4,218,737 | 8/1980 | Buscher et al. | 324/116 |
| 4,301,508 | 11/1981 | Anderson et al. | 324/116 |
| 4,351,028 | 9/1982 | Peddie et al. | 324/116 |

*Primary Examiner*—Ernest F. Karlsen
*Attorney, Agent, or Firm*—Holman & Stern

[57] ABSTRACT

This invention relates to an electricity meter mainly intended for measuring, registration and reading of one or more consumers' electricity power consumption and/or energy consumption. To the electricity meter a display (12) is connected which is adapted to indicate momentary power consumption, present electricity tariff and accumulated energy consumption expressed in monetary units. The electricity meter is an electronic construction and includes a central processing unit (1) with a microprocessor, one sensor(2) intended for detecting of a consumer's power consumption and a number of memory cells (1a–52d) adapted in a predetermined manner to consecutively receive and store information, calculated and transferred by the central processing unit (1). The electricity meter is also adapted to be connected to a read unit (5) by which stored information and electricity tariffs can be transferred to a central computer, located at, for example, an electrical power producer.

16 Claims, 8 Drawing Figures

MICROPROCESSOR BASED ENERGY CONSUMPTION METER

This is a continuation of application Ser. No. 684,173, filed Dec. 21, 1984, now abandoned, which in turn is a continuation of Ser. No. 348,052, filed Jan. 26, 1982, now abandoned.

CROSS-REFERENCE TO RELATED APPLICATIONS

The present application is derived from PCT International Application No. PCT/SE81/00163, filed June 4, 1981, and including the United States of America as a designated state.

BACKGROUND OF THE INVENTION

The present invention refers to an electricity meter, preferably intended for measuring, registering and reading consumer's power consumption and/or energy consumption. In presently established power distribution networks, producers in utilities all over the country transfer electricity from power generating plants to the consumers. A great deal of the energy is distributed to low voltage subscribers, as for example domestic or residential users. Usually every consumer has at least one conventional electro-mechanical electricity meter intended for registration of the consumers' consumption of electrical energy during a predetermined time period. Conventional mechanical electricity meters mainly comprise a rotating disc, the speed of rotation of which is influenced by the consumers' momentary power consumption. The rotary movement is mechanically transferred to a counting device, which registers the energy consumption, for instance, in units of kWh. This conventional electricity meter must of course be manually read at regularly recurring time intervals by meter inspectors employed by the producer. The electrical energy which is produced by the power generating plants is usually supplied to the distributing network in large areas where the networks are interconnected and is, in this way, transferred to the consumer.

Depending on the type of power generating plant that produces the electrical energy, the cost of production will fluctuate. In the conventional power distribution network the momentary production cost, or the so called short time marginal cost, cannot directly influence the debiting for the amount of energy the consumer has consumed; rather, the fee for the electrical energy is primarily gathered through fixed tariffs mainly based on the long term marginal cost. A load on the distributing network is gathered by needs and the load varies heavily during day and night. Great variations occur between day and night, between different seasons like summer and winter. Because of bad correlation between the cost for production and the tariff, there is no stimulus for the consumer to change pattern of behavior concerning energy consumption and therefore the irregular load on the distribution network remains.

This, in combination with the fact that a conventional electricity meter does not show the consumer's power consumption in easy readable form, the consumer has no opportunity to observe momentary electricity consumption and its cost. The effect of conservation efforts accomplished by the consumer cannot be identified and this would, of course, not influence the consumer's conservation efforts.

To the electric power producer the peak load of the energy consumption determines how new electric power stations should be constructed. The production capability must be dimensioned for the largest possible load peaks to keep the voltage on the distribution network at a constant level. If these peak loads could be distributed over time, the dimension of the electric power station could be set to a lower peak power level and be built for a lower cost which, of course, influences the energy tariff. Also the distribution network, such as transmission wires, transformers, and the like, could be dimensioned for smaller power levels and be used at more uniform loads which is naturally more economical, both for the power producer and for the country.

It is therefore desirable to make the consumer aware of his momentary power consumption and make it possible to change the tariff dependent on whether the production cost for electric energy goes up or down. By providing every consumer with information about their energy consumption and putting this in relation to the existing tariff the consumers could be more aware about their costs. This could in turn influence the consumer to transfer at least a part of their energy consumption to periods during the day and night, or during the year, when energy production cost is lower. This could, for example, result in consumers heating their houses or flats partly during the night. Use of washing machines, dish washers, dryers, and the like, could also preferably be moved to periods when the load on the distribution network and the energy tariff is lower. If the consumer could always be aware of his momentary power consumption and its cost, the consumer's propensity to save would increase. In the long run this could bring about lower costs for new electric power stations and for new distribution networks for electric energy transmission.

Electricity meters adapted for indication of consumers' momentary power consumptions, and/or for indicating used energy by, for instance, monetary units, are previously known (for example U.S. Pat. No. 3,683,343). This invention concerns an energy meter system and has a number of disadvantages. Among others, the electricity meters, mainly of mechanical configuration, include a number of retardation coils, which heavily limit the number of values or tariffs possible to transmit on the distribution network for use in costs calculations. The reason is the bandwidth required to transmit the various tariffs, because every rate value consists of one code or signal superimposed on the electricity distribution network. This brings about that only a few tariffs, with relatively large differences among them, can be used. Another disadvantage is that the consumers have opportunity to read their present energy consumption on this electricity meter, because the different tariff signals provided to the meter influence the speed gear and make it rotate with another speed when the energy tariff is changed. The accumulated energy cost shown on the electricity meter is therefore not an adequate value on the consumers accumulated energy consumption, counted in kWh, which naturaly is completely unsatisfying from the consumer's point of view, because the accuracy of the registered consumption is difficult to control. This electricity meter is also more expensive to manufacture, even in long series, because of its fine mechanical construction, and its reliability could be questioned.

THE PURPOSE AND THE MAIN FEATURE OF THE INVENTION

The purpose of the present invention is to construct an electricity meter which eliminates the above related disadvantages and which detects a consumer's power consumption, integrates it over time, accumulates the energy consumption, calculates the momentary power consumption in proportion to the present energy tariff, and shows this present energy tariff and the cost of the momentary consumption and the accumulated energy consumption via a display.

A further purpose is that by means of the invention it would be possible to define a tariff which is proportional to the energy producer's production and transmitting costs.

A further purpose of the invention is to show an electricity meter by which the energy producer's reading of the consumer's accumulated energy consumption and changes of the tariff that may occur would be essentially simplified whereby the costs for this work would be reduced.

The electricity meters should furthermore make it possible to change the consumers' energy consumption pattern so that a higher degree of energy consumption takes place at periods when a lower tariff is in effect. As a consequence, an allocation of the load on the distribution network and a saving effect for the consumer is obtained.

This can be accomplished by a number of storage cells, each adapted to, from a central processing unit, consecutively receive and store information related, during a predetermined time period and by at least one sensor, to detected energy consumption.

DESCRIPTION OF THE PREFERRED EMBODIMENT

Figure 1:
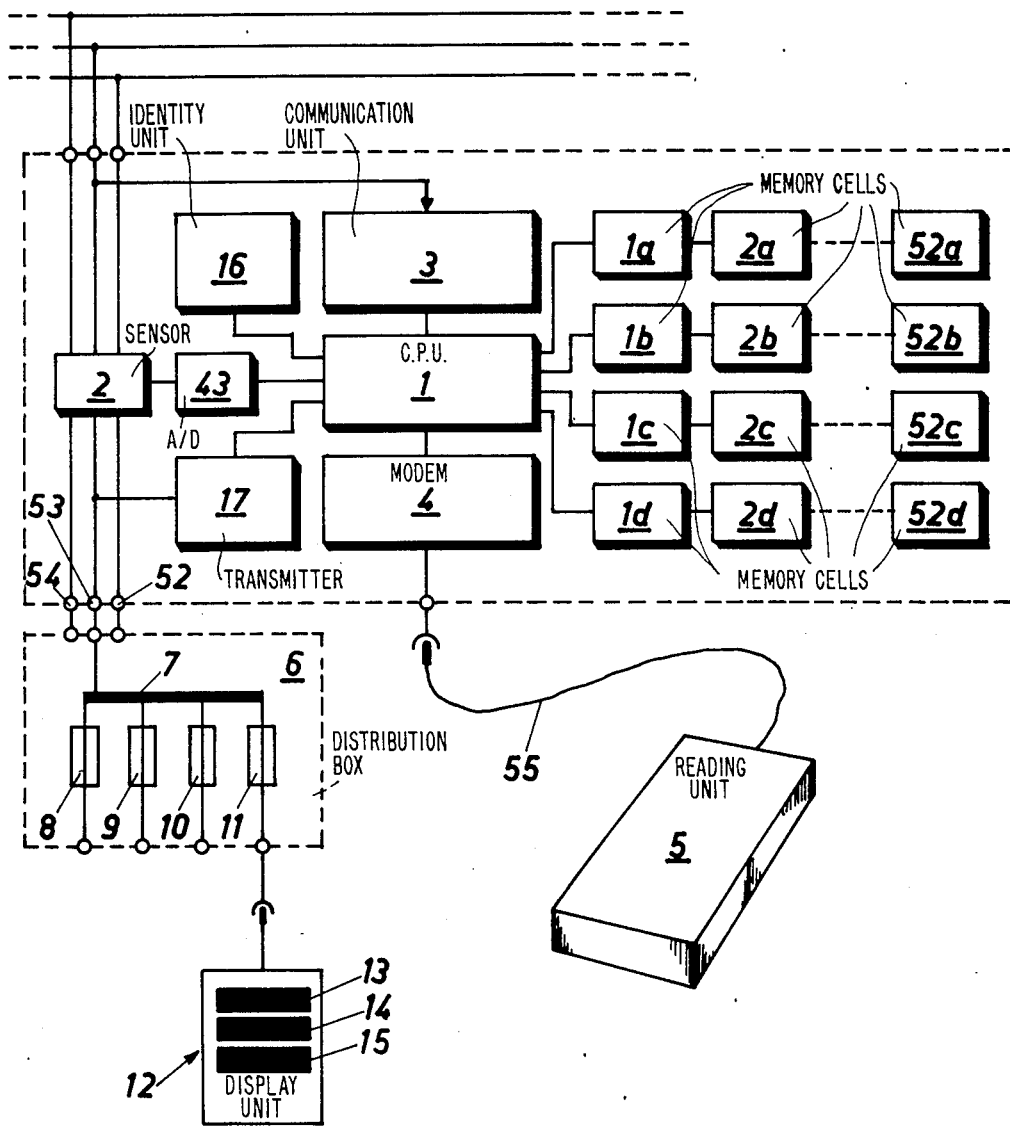
FIG. 1 shows a block diagram of an electricity meter, according to the invention, including a communication unit.

The present invention relates to an electricity meter comprising, as is shown in FIG. 1, a number of units schematically described as blocks. The most complex unit consists of a central processing unit 1 which controls input and output of signals and data. The central processing unit 1 is suitably composed of, among other things, a microprocessor which in this embodiment is of the type INTEL-8095. Conventional memory units and interface units constitute the microprocessor peripheral equipments. A number of external blocks, as for example additional memory units and interface modules, are connected to the central processing unit 1. Several of the memory cells ($1a$–$52d$) are adapted in so called EAROM-circuits (Electrically Alterable Read Only Memory), whose advantage is that when power failure occurs, the input data remains unchanged. This is very important because short power failure may easily appear on the distribution network.

The central processing unit 1 is, via an analog-digital converter 43, also connected to a sensor 2 adapted to current detect the consumer's power consumption. In the case when the consumer is connected to all three phrases on the distribution network, the measurement is carried out individually on each phase so that the registration of the consumer's total power consumption can be done. The sensor can be designed in many ways and it may, for example, consist of a so-called multiplication sensor or a single sensor consisting of one or more so-called Hall effect devices. As sensor 2 a conventional, electromechanical, kWh-meter can also be used, for example, by providing it with an optical reading device so that the speed of the rotating disc in the electricity meter can be detected.

For the purpose of making it possible to transfer information, such as point of time or tariffs, to the present electricity meter, there is a communication unit 3 connected between the central processing unit 1 and one or more phases of the distribution network. In this way a coded signal superposed on the distribution network can be received and separated from the voltage of the distribution network. Such a transmitted signal is best modulated with a frequency of about 100 kHz and consists of different signal parts. One signal part may, for example, form an address part and another signal part may define a data part, and both signal parts may also be provided with control code signals so that the effect of possible noise on the distribution network would be considerably eliminated. The communication unit 3 acts only as a receiver and is therefore, in this embodiment, only able to receive signals.

The modem 4 connected to the central processing unit 1 makes it possible to connect a releasable external reading unit 5 in which stored information in the electricity meter can be transmitted, for example in coded data form. The modem 4 and the reading unit 5 may also be provided for communication in both directions; i.e., instructions, for example information of new tariffs or other data intended to be stored in different memory cells of the electricity meter, may therefore be transmitted from the reading unit 5 to the electricity meter. The modem 4 is therefore adapted, at current reading, to transfer the stored information in the memory cells to an external data bank (not shown) via the reading unit 5. It is naturally also possible that the electricity meter, via a modem 4, is permanently connected to the telephone network or other intended connection lines. The transmitting of information in both directions can in this way frequently be carried out.

The reading unit 5 consists, like the central processing unit 1, of one microprocessor, program memories and matching networks. Additionally, there are also, for instance, data memories. The connection of the microprocessor, the program memories and the matching network, are carried out according to conventional principles. That is why it is not described in detail here. The data memories, in which information is stored before transfer to the central computer, comprise mass memories such as a cassette tape recorder, EAROM's or bubble memories. The reading unit 5 is removably connected to the electricity meter via a cable 55 provided with a multipolar contact plug. The program routine consists among other things, of an identity control where the specific identity code (ID) of the electricity meters, together with information about the consumers' accumulated consumption, and the cost for this, is stored in the memory of the reading unit 5.

Naturally the reading unit 5 may be provided with an indicator and a key set for visual control of the information and manual registration of the new tariffs.

The power outputs 52, 53, 54 of the electricity meter are connected to the conventional distribution box 6 where each phase is connected to a rail or bus 7 (only one is shown) and to fuses (8–11). The system electricity at every consumer is not influenced and is not to be changed because of the construction of the electricity meter. No changes of wall contacts or wires are necessary at the installation of the present electricity meter. However, the electricity meter is constructed to transmit information about the momentary power consumption and the accumulated energy consumption since the last reading, as well as the present tariff, from the electricity meter to the external distribution network at the consumer location, to a display unit 12, which is connected to the distribution network via a conventional wall contact. The display unit 12 is provided with preferably three indicators 13, 14, 15, for example of the light emitting diodes or a liquid crystal display type, via which alpha-numeric characters can be illustrated. The display unit 12 is furthermore, in the conventional manner, provided with electronic circuits adapted for receiving and decoding information and for driving the indicators 13, 14, 15.

As different groups of consumers, for example homes, industries and the like, often have different consumption behavior and therefore pay different basic fees and electricity tariffs, it is naturally necessary that the transmitting of new tariffs can be carried out selectively to each group of consumers or individual consumers. To make it possible for the signal transferred over the distribution network to cause changes only in the electricity meters desired, an identity unit 16 is adapted to compare the address code transmitted on the distribution network with the unique address code previously programmed in every meter, and only initiate alterations in the meters whose identity code corresponds to the transmitted code.

Figure 3:
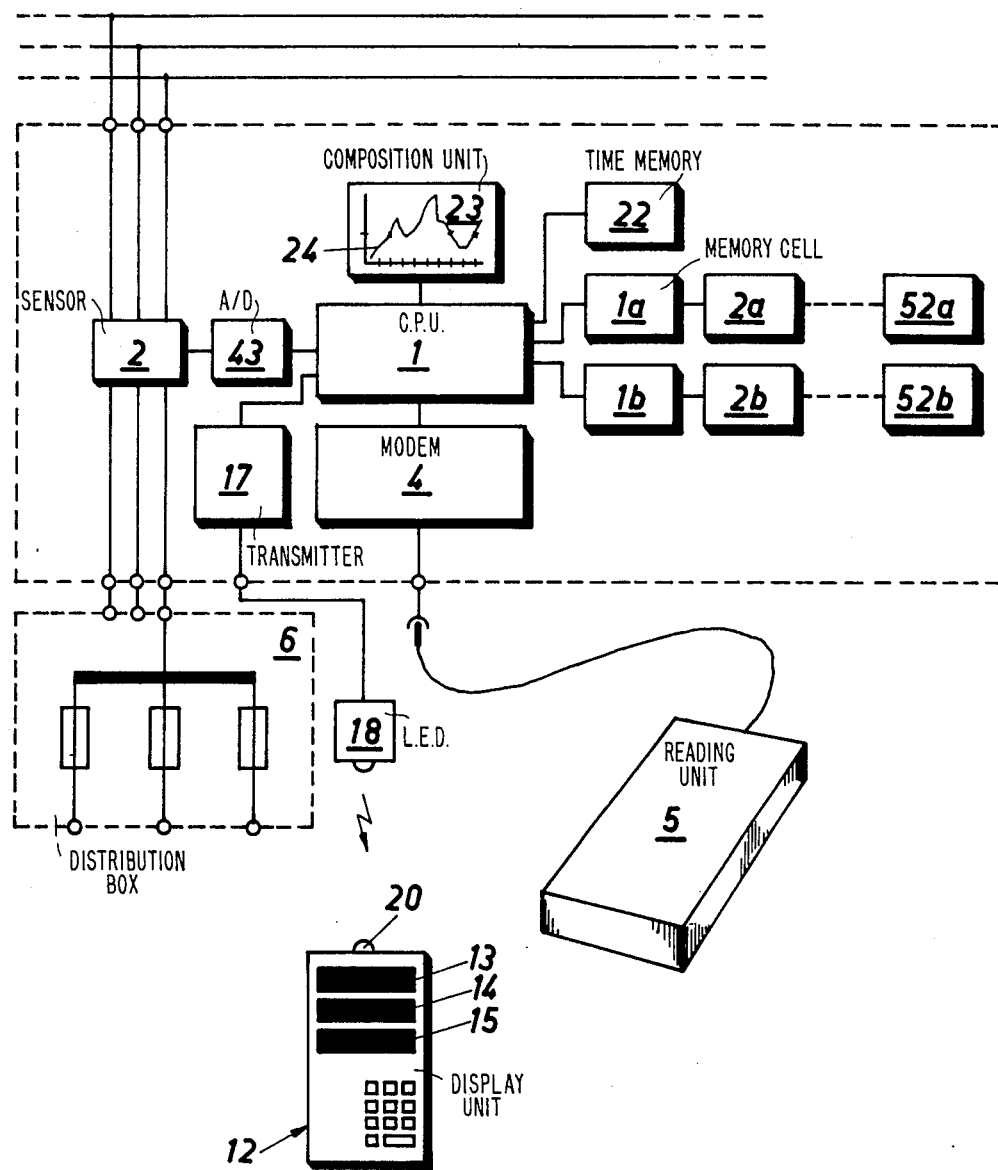
FIG. 3 shows a block diagram of an electricity meter with memory containing 24 hours load values.

In order to provide the display unit 12 with information about momentary power consumption, accumulated energy consumption expressed in monetary units, and present tariff, a transmitter 17 is located between the central processing unit 1 and one or more of the phases of the distribution network. The transmitters 17 convert the information transferred from the central processing unit 1 to a superposed signal code which is transferred to the distribution network. The signal code is thus transmitted via the conventional distribution network to a display unit 12. Another way to transfer information is shown in FIG. 3, where the transmitter 17 is not connected to any of the distribution network phases, but to an infrared light emitting diode 18 located in the room where the display unit 12 is placed. The information from the central processing unit 1 is converted to the infrared light emitter 18, which converts the signal code to modulated infrared light. This light is received by an infrared light receiver 20 arranged at the display unit 12.

Transferring of information from the electricity meter to the display unit 12 can naturally also be done via a therefore intended separate wire, which electrically connects the electricity meter with the display unit 12.

The electricity meter shown in FIG. 1 is furthermore provided with a number of memory cells designated $1a-52d$. These memories are adapted so that four memory cells are used each week for storage of information. This means that the information stored during one year demands 208 memory cells. In the preferred embodiment, for the first week the memory cell $1a$ is supplied with information about the consumer's energy consumption at day time (and this is related to the electricity tariff concerning day time), which is stored in the memory cell $1c$. At night the memory cells $1a$ and $1c$ are both disconnected and the consumer's energy consumption in relation to the electricity tariff stored in the memory cell $1d$ is accumulated and stored in the memory cell $1b$. During the second week of the registration period the memory cells $1a-1d$ are disconnected and the memory cells $2a$ and $2c$ are connected on day time and $2b$ and $2d$ at night time. In this manner all 208 memory cells are used during one year. The electricity meter shown in FIG. 1 is therefore provided with information about point of time during night and day and present electricity tariff via the distribution network and the communication unit 3. If a power failure occurs, the time of the failure, which is necessary for switching between day and night tariff, is automatically restored since the time information is transferred via the distribution network. Because the memory cells consist of so called EAROM-type memories, the stored information in the memory cells $1a-52d$ does not disappear but remains intact practically irrespective of how long the power failure remains. No information will therefore disappear and the electricity meter continues to work as usual after that the power has returned.

Figure 2:
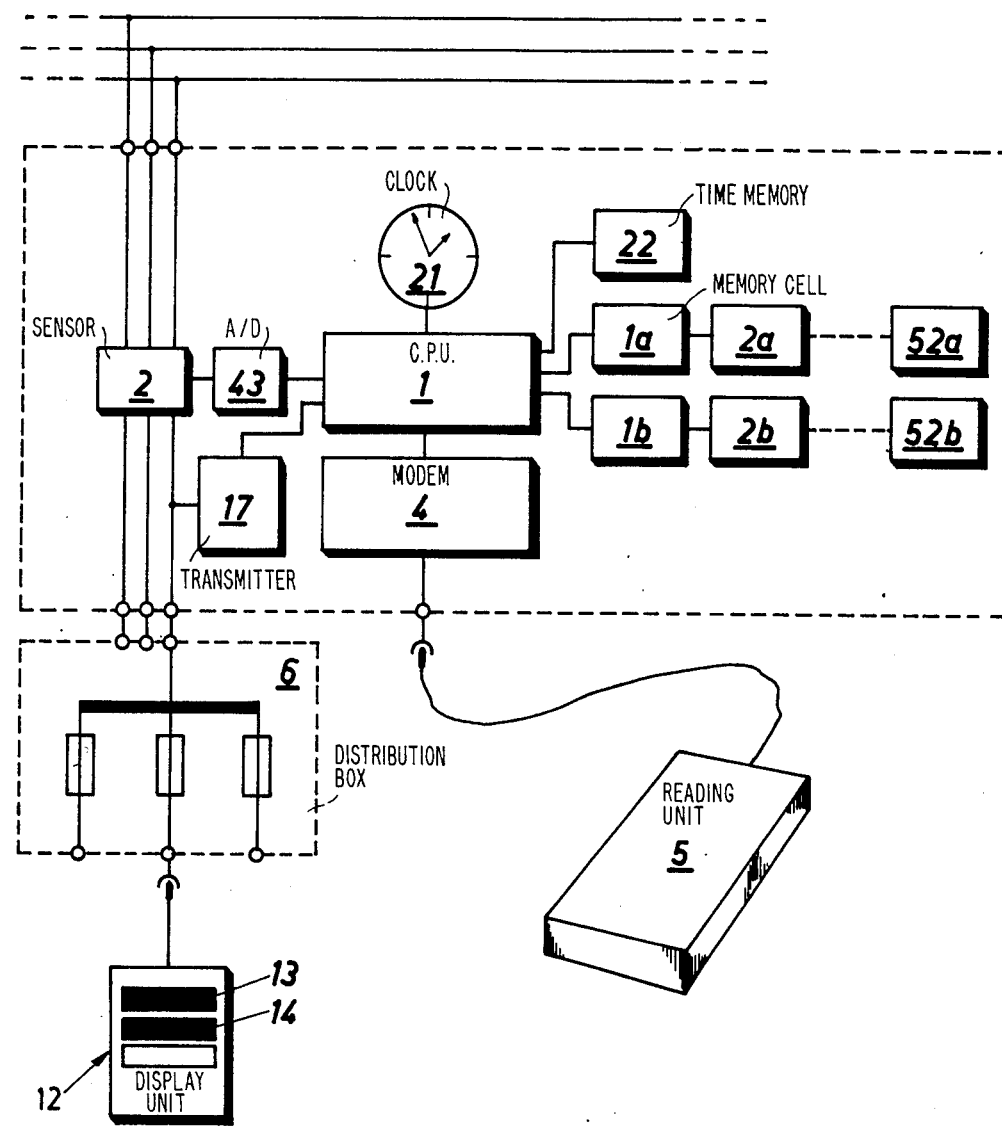
FIG. 2 shows a block diagram of an electricity meter without communication unit, but including an internal clock.

An electricity meter according to the invention, without a communication unit, is shown in FIG. 2. In this case no information is transferred from the distribution network to the electricity meter. Therefore an internal clock 21 is adapted to provide the electricity meter with time information. The clock unit 21 preferably consists of a mechanical clock which starts to work at a power failure. An internal electronic clock circuit (located in the central processing unit, not shown) normally provides the electricity meter with time information, which is currently stored in a time memory 22 of EAROM-type. At a possible power failure the internal electronic clock fails and the mechanical clock unit 21 begins to work. When the power returns on the distribution network the central processing unit 1 automatically controls the difference which has occured between the time information stored in the time memory 22 and the time information which the clock unit 21 has registered. The difference is transferred to the time memory 22 and the central processor unit 1 can go on working as usual. When this electricity meter does not receive current, information about the level of the electricity tariff, information about the 24 hours rhythm of the seasons, must be stored. This method of arranging memory cells brings about that a differentiation of the debiting for night and day tariff from week to week during the year can take place. Because of the lack in the communication, the electricity meter is not provided with an identity unit (see FIG. 2).

In FIG. 3 a further alternative of an electricity meter according to the invention is shown. This one differs from the electricity meter shown in FIG. 2 in the manner that the clock unit 21 is displaced by a normal consumption unit 23, via which the electricity meter adjusts the internal electronic clock after a power failure. This proceeds in a way that the consumer's power consumption is currently stored and restored in the normal consumption unit 23. Information with special characteristics for the consumer is therefore always stored in the normal consumption unit 23. Because the consumer's consumption pattern does not show great variations from day to day, it is possible for the central processing unit 1, after a power failure, to control the location on the normal consumption graph 24 at which the power consumption is at present and thereafter determine the present point of time. The internal electronic clock can in this manner be set with relatively good precision. Since a microprocessor is used in the electricity meter for handling and calculations of data, the microprocessor also can be used in a relatively complex calculation program in such a way that the point of time is better and better adjusted and finally corresponds to the normal consumption graph when additional values on the graph are detected after a power failure.

Figure 8:
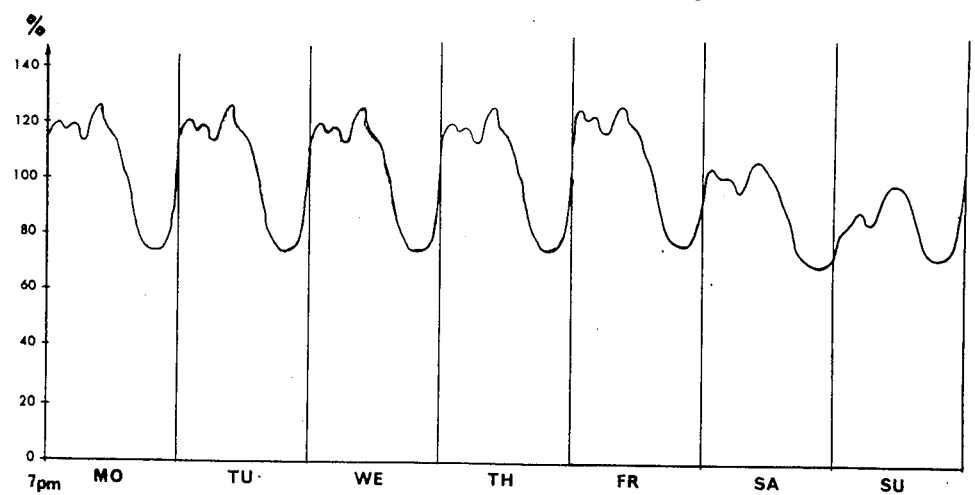

With this invention it is naturally also possible to store data in the memory cells of the electricity meter about the total electricity consumption in the country, expressed per time period. The data about this electricity consumption may for example be collected from historical year consumption graphs, week load graphs and/or consumption graphs concerning the 24 hours. An example of a week's consumption graph is shown in FIG. 8. The vertical axis corresponds to percentage of a week's average consumption and the horizontal axis corresponds to the days of the week. It is seen how the load varies on the distribution network during a 24 hour period and during a week. If consideration is also given to the variations during the year, for example the summer consumption or the winter consumption, the present electricity tariff may automatically be adjusted in the electricity meter in such a manner that the costs for the consumer's electricity consumption per kWh is reduced when the total electricity consumption in the country by experience is low, for example at night time and during the summer. New, restored consumption graphs can thereafter be transferred to the electricity meter when they are changed so that the costs for the electricity energy will be as proper as possible.

The storing of all these variations, such as load data, tariffs and so on, is made possible thanks to the new developed memories. A great number of memory cells today go into small chips, often not bigger than an ordinary integrated circuit. In electricity meters of this kind some types of solid state memories are suitable. Other memory types are naturally also possible to use, and it is also possible to use memories which at present are under development.

If a number of memories are used every 24 hours, such as, for example, memory cells for days, evenings and nights consumption, and corresponding memory cells are used for, for example, predetermined day, evening and night tariffs, about 2200 memory cells each year will be needed which, with present day memories, occupies a neglectable volume in the electricity meters. In this way it is possible for the consumer to continuously read, for example, present debiting per kWh, and naturally the momentary electricity consumption and the total cost for the accumulated energy consumption.

It is also possible to register the consumer's real electricity consumption at different points of time in the electricity meter, such as day, evening and night consumption for each 24 hours during the year instead of storing normal load values, and afterwards, by means of a central computer, compare the consumer's electricity consumption with power producers' production costs or the country's total electricity consumption, of each period, and then stipulate the tariffs. This procedure has however several disadvantages. The consumer cannot, for example, receive current information about present tariff and consequently he cannot dispose his electricity consumption to periods when the electricity is cheaper. Neither can information be received of the cost for the total accumulated energy consumption.

Figure 4:
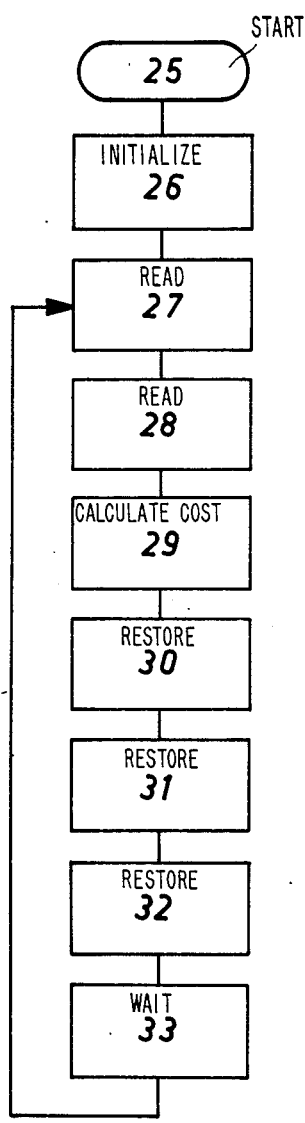
FIG. 4 shows a flow chart of the principal function of an electricity meter.

FIG. 4 shows a program flow diagram, which describes the functioning of an electricity meter provided with communication unit 3. Every symbol in the program flow diagram is described shortly referring to their function.

Figure 5:
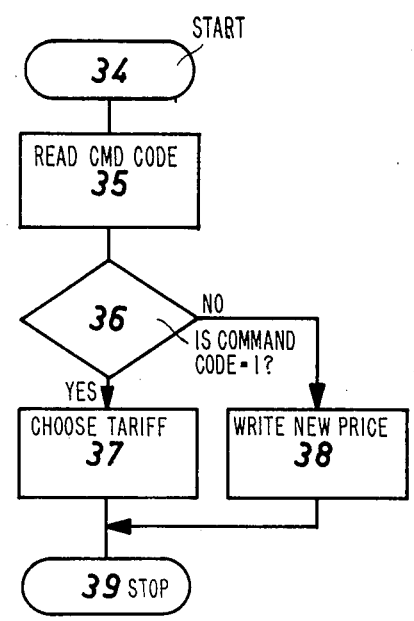
FIG. 5 shows a flow chart of en electricity meter comprising a unit adapted for one-way communication.

25:start
26:initiating of the communication unit (moves ID-number to another memory)
27:read the energy price from memory
28:read momentary power consumption
29:calculate the cost of the consumption
30:restore accumulated cost memory
31:restore present energy consumption in day, night or weekend memory
32:restore the display unit
33:wait one second FIG. 5 shows in a corresponding manner a program flow diagram of an electricity meter including communication in one direction, i.e., only receiving. The flow diagram sumbols 34–39 are described shortly in the same manner as above.

Figure 6:
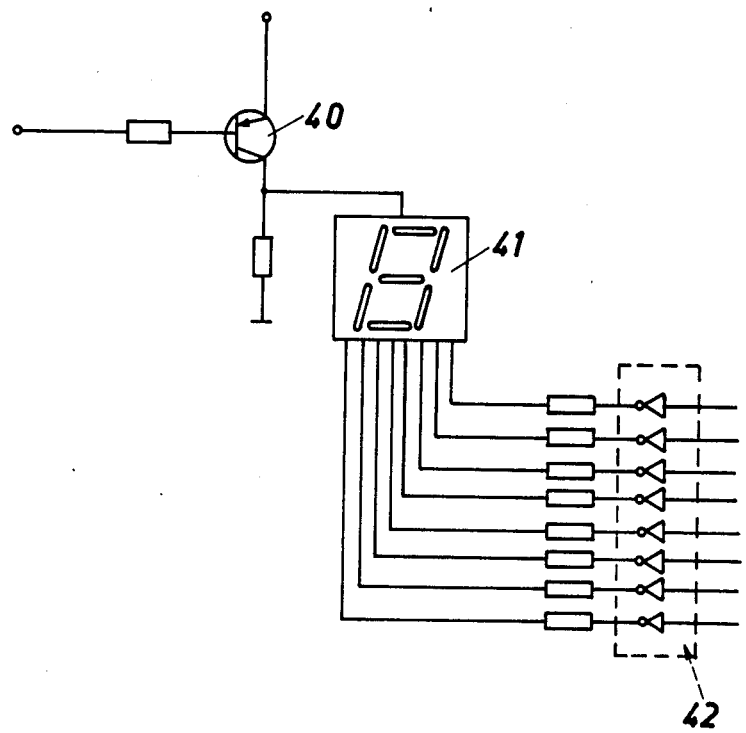
FIG. 6 shows schematically a circuit diagram of a driver of an indicator.

34:starts at message from the electric power station (individual address or group address code)
35:read command code received via the communication unit
36:is the command code similar to 1
37:choose day, night or weekend tariff, based on present point of time and write in suitable memory
38:write new energy price in the energy price memory
39:stop In FIG. 6 is shown a circuit diagram concerning a part of the driving devices intended for the indicators 13, 14, 15 of the display 12. A transistor 40 supplies the indicator 41 with current in a way that some or all of the seven segments of the indicators are switched on. Which segments are activated depends, among other things, on the signals received from the outputs of inverters 42.

Figure 7:
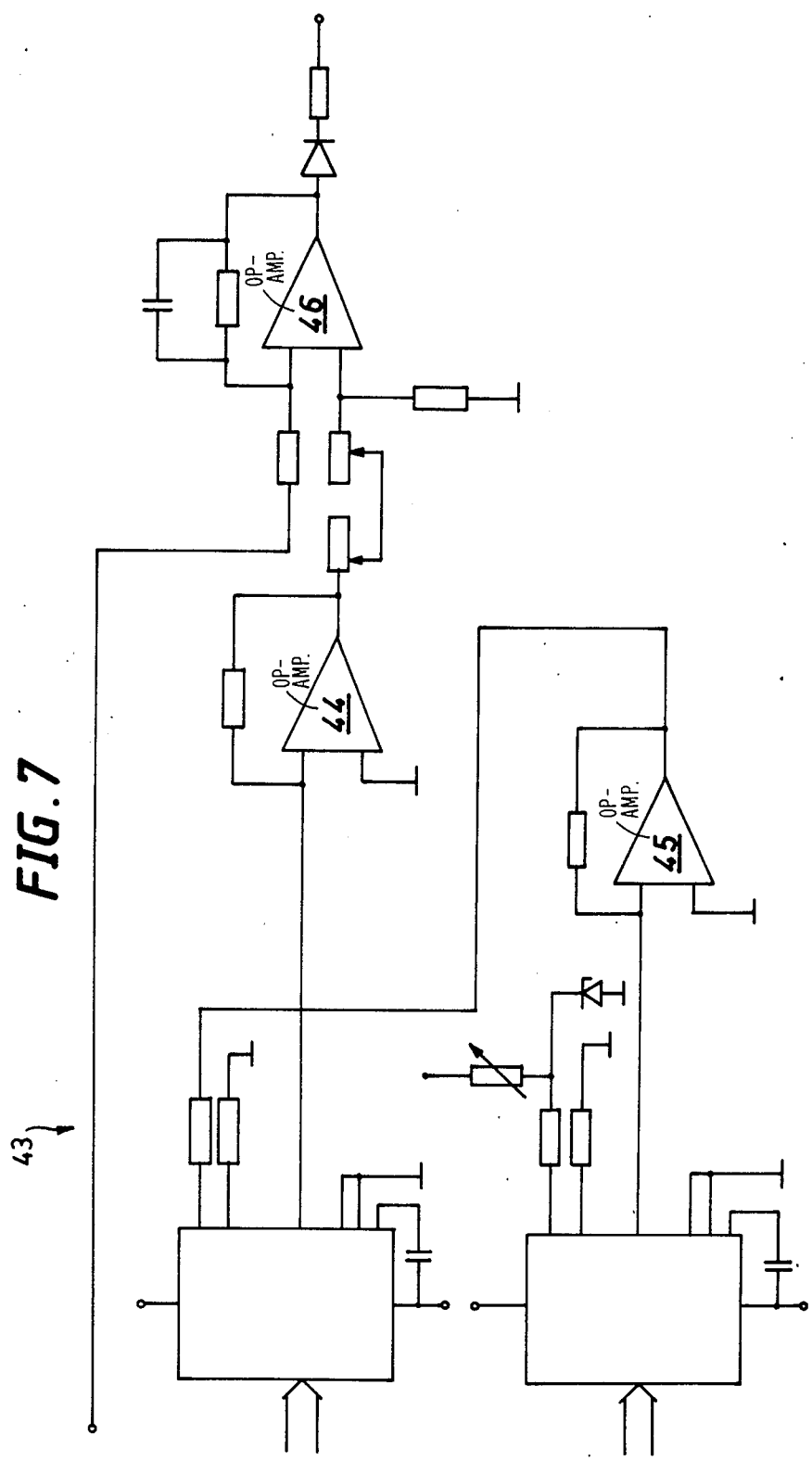
FIG. 7 shows a circuit diagram of an analog-digital-converter, and, FIG. 8 shows a load graph for a week in December in Sweden.

FIG. 7 shows a circuit diagram of an analog-digital converter 43, which converts the analog signal from the sensor 2 to a digital signal which can be received and calculated by the central processing unit 1. The analog-digital converter consists mainly of conventional electronic components, such as, for example, operational amplifiers 44, 45, 46, a number of diodes, capacitors and resistors. The construction and function of the analog-digital converter is well known and is therefore not described in detail here.

The invention is naturally not limited to the above related preferred embodiment but a number alternative embodiments are possible within the claims.

We claim:

1. An electricity meter for measuring, registering and reading a consumer's electrical energy consumption via an energy distribution in which the cost per unit energy of consumption differs from time to time, comprising:
a sensor providing an output signal representative of the electrical energy supplied to a consumer;
a time signal generating means;
a plurality of memory cells;
a central processing unit for calculating the power and/or energy supplied to the consumer from said output signal and storing the calculated values in the memory cells, said central processing unit receiving information as to the real time from the time signal generating means and information as to the tariff related to said real time from the memory unit;
a read out means for the contents of the memory cells; there being at least two groups of the memory cells;
the number of groups of memory cells corresponding to the number of particular portions of the billing period for which separate power and/or energy values are to be obtained;
each group including first cells separately storing the various tariffs applying to different periods within a day and night belonging to the particular partial period associated with said group, and second cells separately storing the power and/or energy values calculated for said particular partial period;
the groups being successively connected to the central processing unit under the control of the time signal generating means.

2. The electricity metering system according to claim 1 wherein each of said predetermined units of time corresponds to a twenty-four hour period.

3. The electricity metering system according to claim 1 wherein said predetermined function is the amount of energy consumed in energy units.

4. The electricity metering system according to claim 1 wherein said predetermined function is the cost of energy consumed in monetary units.

5. The electricity metering system according to claim 1 further comprising:
remote readout means for selectively receiving and storing values stored in said memory cells; and
modem means detachably connected to said readout means for transferring stored values from said memory cells to said readout means.

6. The electricity metering system according to claim 5 wherein said readout means comprises means for transferring the received and stored values to an external data processing medium.

7. The electricity metering system according to claim 1 further comprising display means for displaying to the consuemr indicia related to the consumer's energy consumption.

8. The electricity metering system according to claim 7 further comprising:
means for storing the per unit cost of electrical energy consumption in effect at different times of the day; and
wherein said display means includes means for numerically displaying the contemproaneous per unit cost of electrical energy consumption in effect, and means for numerically displaying the present rate of consumption of electrical energy by the consumer.

9. The electricity metering system according to claim 8 wherein said display means further includes means for numerically displaying the accumulated cost of energy consumed by the consumer during a predetermined period of time.

10. The electricity metering system according to claim 8 further comprising infrared light transmitter means for transmitting information for display to said display means.

11. The electricity metering system according to claim 1 further comprising receiver means for receiving and and demodulating energy cost-related data which is in the form of frequency modulation on said power lines.

12. The electricity metering system according to claim 1 further comprising normal consumption storage means for storing information concerning the consumer's energy usage pattern as a function of time of day.

13. The electricity metering system according to claim 12 further comprising means responsive to restoration of power to the consumer after a power failure for comparing contemporaneous energy consumption by the consumer to the information stored in said consumption storage means in order to determine the approximate time of power restoration.

14. The electricity metering system according to claim 1 further comprising:
memory cell identification means for storing a plurality of unique codes identifying respective memory cells in said plurality of memory cells; and
means including said memory cell identification means for selectively addressing each of said memory cells.

15. The electricity metering system according to claim 14 wherein said memory cell identification means includes further means for storing additional information relating to said memory cells to its respective time interval, said further means for storing including means for retaining said additional information in the event of a power failure.

16. The electricity metering system according to claim 1 further comprising:
electrically powered time measuring means for continuously monitoring time at said system;
mechanically powered time measuring means, actuable in response to electrical power failure in said network and at said system, for measuring the elapsed time of said power failure; and
means responsive to restoration of power after a power failure for resetting said electrically powered time measuring means in accordance with the time measured by said mechanically powered time measuring means.

* * * * *